(12) United States Patent
Thakur et al.

(10) Patent No.: US 11,139,553 B2
(45) Date of Patent: Oct. 5, 2021

(54) TECHNOLOGIES FOR A METAL CHASSIS FOR AN ELECTRONIC DEVICE

(71) Applicant: Intel Corporation, Santa Clara, CA (US)

(72) Inventors: Jayprakash Thakur, Bangalore (IN); Prakash Kurma Raju, Bangalore (IN); Prasanna Pichumani, Bangalore (IN); Akarsha Kadadevaramath, Karnataka (IN)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 16/233,791

(22) Filed: Dec. 27, 2018

(65) Prior Publication Data

US 2019/0131692 A1 May 2, 2019

(51) Int. Cl.
*H01Q 1/24* (2006.01)
*H01Q 1/38* (2006.01)
*H05K 5/04* (2006.01)
*C25D 11/00* (2006.01)
*C25D 11/12* (2006.01)
*C25D 11/18* (2006.01)

(52) U.S. Cl.
CPC ............... *H01Q 1/24* (2013.01); *C25D 11/00* (2013.01); *C25D 11/12* (2013.01); *C25D 11/18* (2013.01); *H01Q 1/243* (2013.01); *H01Q 1/38* (2013.01); *H05K 5/04* (2013.01)

(58) Field of Classification Search
None
See application file for complete search history.

(56) References Cited

U.S. PATENT DOCUMENTS

| | | | | |
|---|---|---|---|---|
| 2005/0079903 A1* | 4/2005 | Taketomi | ............... | H01Q 1/243 455/575.5 |
| 2014/0361934 A1* | 12/2014 | Ely | ............... | H01Q 1/24 343/702 |
| 2015/0125636 A1* | 5/2015 | Chan | ............... | C25D 11/022 428/34.1 |
| 2016/0201178 A1* | 7/2016 | Oota | ............... | C23C 18/12 428/472.2 |
| 2016/0204502 A1* | 7/2016 | Misra | ............... | H01Q 1/243 343/702 |
| 2017/0346162 A1* | 11/2017 | Han | ............... | H01Q 1/243 |

* cited by examiner

*Primary Examiner* — Louis J Rufo
(74) *Attorney, Agent, or Firm* — Hanley, Flight & Zimmerman, LLC

(57) ABSTRACT

Technologies for a metal chassis for an electronic device are disclosed. A manufacturer may manufacture a chassis of an electronic device by machining a recess into a chassis preform and perform an anodization of the chassis. The manufacturer may machine the side of the chassis preform opposite the recess to a predefined thickness, and then perform a subsequent anodization. The predefined thickness is selected so that, after the subsequent anodization, there is a single anodized layer between the surface of the recess and the chassis surface on the opposite side. The single anodized layer is non-conductive, allowing electromagnetic signals of an antenna to pass through.

19 Claims, 7 Drawing Sheets

TECHNOLOGIES FOR A METAL CHASSIS FOR AN ELECTRONIC DEVICE

BACKGROUND

Electronic devices often include one or more antennae to communicate with other electronic devices. For example, a mobile phone may include a Wi-Fi antenna, a cellular antenna, a Bluetooth® antenna, etc. A desired characteristic of an antenna may be that it can send and receive signals in nearly any direction, regardless of the orientation of the mobile phone.

Construction of the electronic device may be limited based on a desired antenna performance. For example, a metal part of a chassis may block electromagnetic waves from being transmitted and received by an antenna in a certain direction. A chassis may be broken up into multiple pieces in order to allow for the antenna to operate with better directionality.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
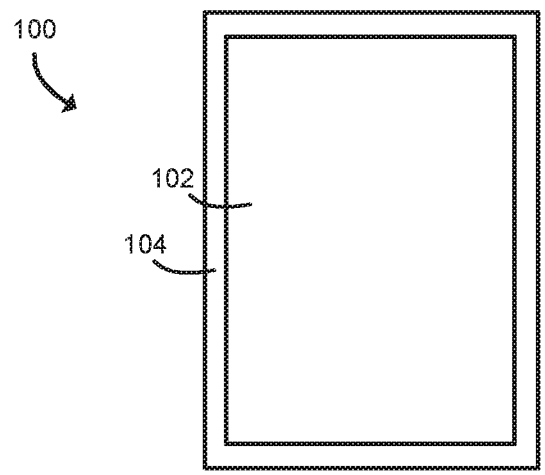
FIG. 1 is a top-down view of at least one embodiment of a chassis preform for an electronic device.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an illustrative chassis preform 100 of an electronic device may be made of aluminum or an aluminum alloy. As discussed in more detail below, the chassis preform 100 may be machined and otherwise manipulated to create a non-conducting anodized layer through which electromagnetic signals to and from an antenna may pass. The anodized layer may be created without creating any holes, gaps, or seams in the chassis preform 100. The approach described herein may allow for a chassis of an electronic device to be manufactured that allows electromagnetic signals to be sent and received through an anodized layer. It should be appreciated that such a chassis may, in some embodiments, be a single piece without any seams, holes, or gaps required to allow for electromagnetic waves to pass to and from the antenna. The machining processes used to create the chassis preform 100 shown in FIG. 1 or the chassis preform 100 at any other time in the processes described herein may be any suitable machining process or equipment, such as a computer numeric control (CNC) machining tool, chemical etching, polishing, drilling, etc.

The chassis preform 100 may be made of any suitable metal, such as aluminum or an aluminum alloy. In the illustrative embodiment, the chassis preform 100 is aluminum alloy 6063 defined in "Aluminum Standards and Data" published by The Aluminum Association in 2017. In other embodiments, the chassis preform 100 may be another aluminum alloy, such as another aluminum alloy defined in "Aluminum Standards and Data." The chassis preform 100 may be at least 90%, 95%, or 97.5% aluminum by weight. In other embodiments, the chassis preform 100 may be titanium, zinc, magnesium, niobium, zirconium, hafnium, tantalum, or an alloy of one of those metals. The chassis preform 100 may be for use as a chassis for any suitable electronic device, such as a smartphone, a cellular phone, a tablet computer, a laptop computer, a notebook computer, a consumer electronic device, a wearable computer, a handset, a messaging device, a camera device, and/or any other electronic device.

The chassis preform 100 may be at any stage of the manufacturing process of the chassis or the planned electronic device. For example, in the illustrative embodiment, the chassis preform 100 may be machined such that there is a raised edge 104 that may operate as a side of the chassis of the electronic device. It should further be appreciated that the chassis preform 100 may have any number of features not shown, such as holes for buttons, speakers, microphones, charging cable, etc. or other features such as a recess, outcropping, pattern, on the chassis preform. The illustrative chassis preform 100 has a top surface 102 that is flat or approximately flat. It should be appreciated that, although terms such as "top" and "bottom" may be used, the chassis preform 100 may be machined in any orientation, so that the top surface 102 may be oriented in different directions in different stages of the manufacturing process. In the illustrative embodiment, the chassis preform 100 may be a metal block that is approximately rectangular with a height and width of, e.g., 25 to 250 millimeters (mm) and a thickness of, e.g., 0.4 to 6 mm. The raised edge 104 may be any suitable thickness, such as 0.5 to 2 mm, and any suitable height, such as 1 to 5 mm. The chassis preform 100 may in other embodiments may be different shapes, sizes, or thickness, such as an oblong shape, a rounded or curved shape (including a curved surface 102), a square shape, etc.

Figure 15:
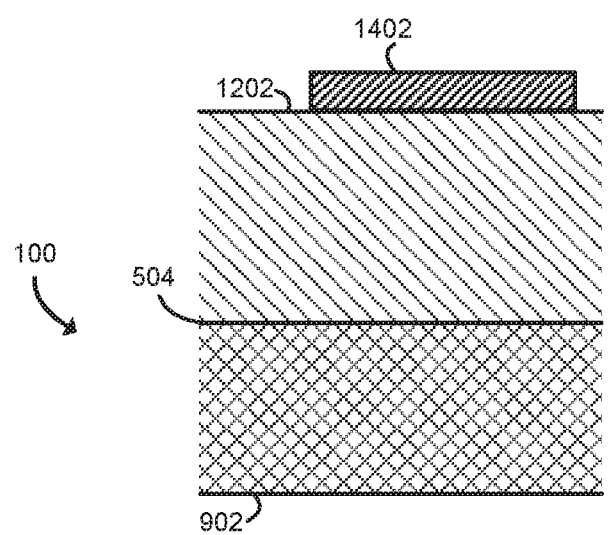
FIG. 15 if a cross section of the chassis preform with the plastic insert with an antenna on the plastic insert shown in FIG. 14.
Figure 16:
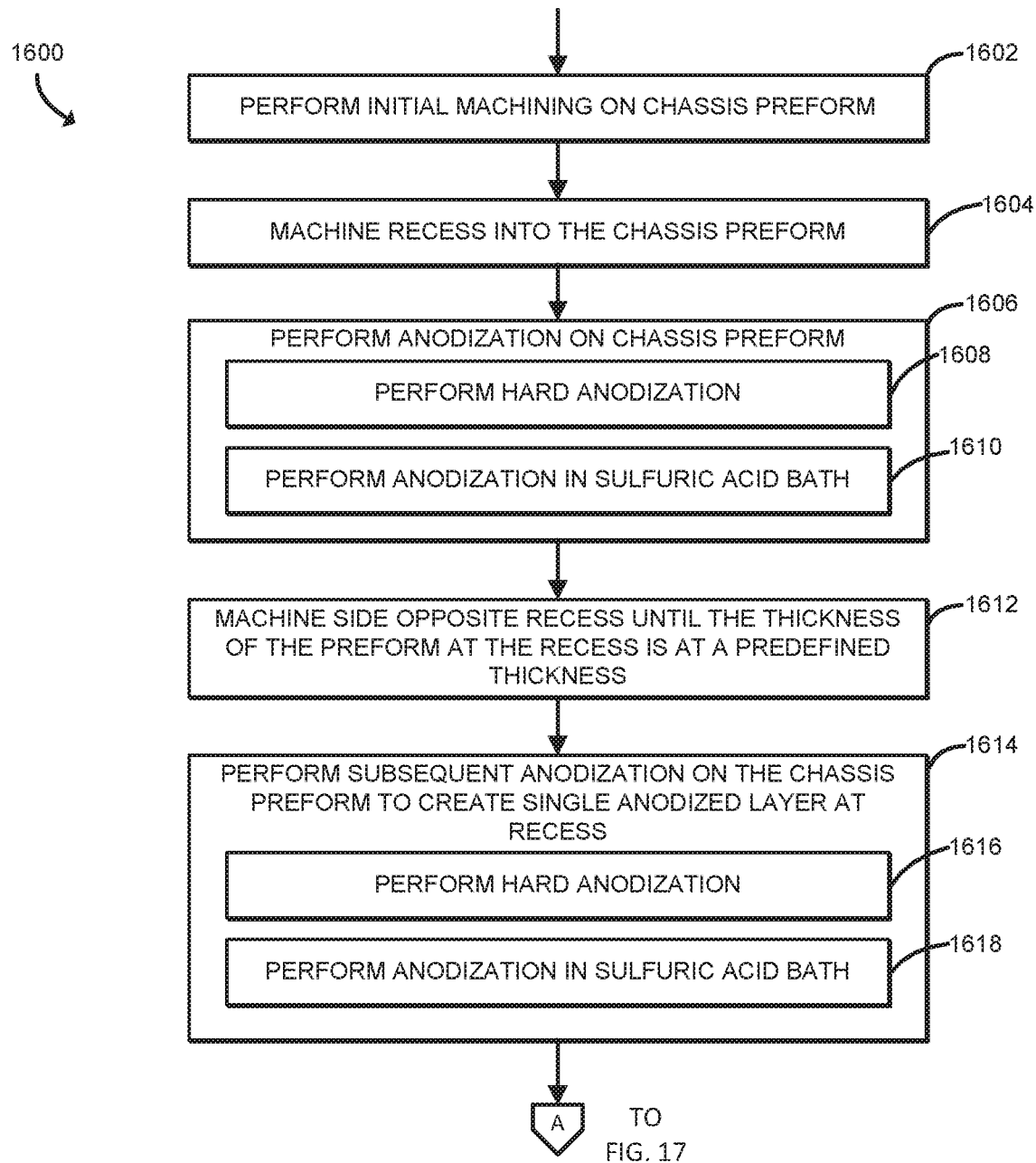
FIGS. 16-17 are a simplified flow diagram of at least one embodiment of a method for creating a chassis.
Figure 17:
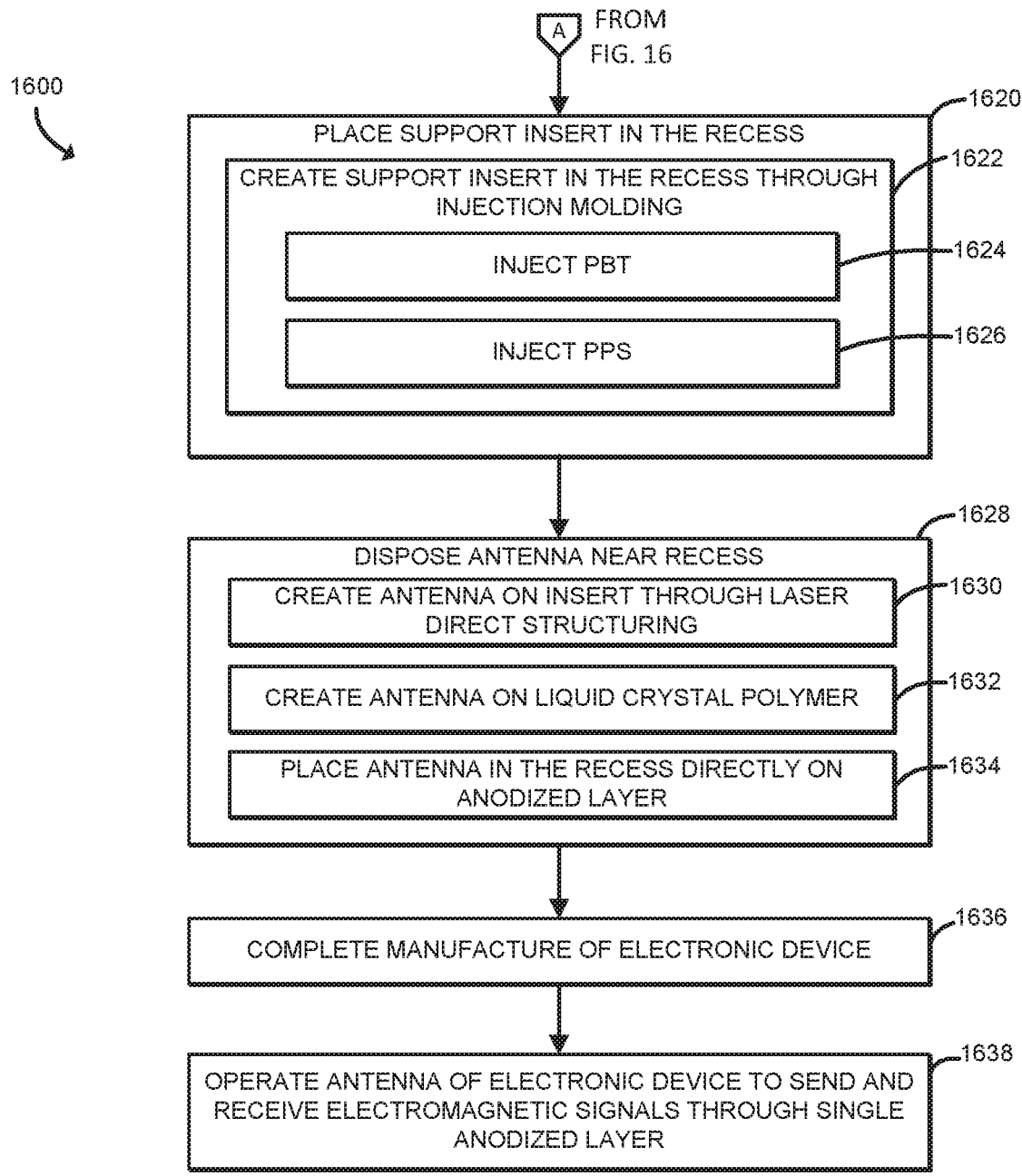

FIGS. 1-15 show a chassis preform 100 in different stages that correspond to different steps of one embodiment of a manufacturing process described in the method 1600 describes in FIGS. 16 & 17. In the interest of clarity, FIGS. 1-15 will be described with reference to the method 1600.

Referring now to FIG. 16, the method 1600 for manufacturing a chassis of an electronic device begins in block 1602, in which a manufacturer may perform initial machining on a chassis preform 100 using a suitable machining tool or machine. In this context, "manufacturer" may refer to one or more individuals, one or more companies or corporations, or any other entity or entities that manufacture a chassis using the chassis preform 100 and suitable machining tool, device, or system as discussed above. In some embodiments, a system may automatically perform all or substantially all of the method 1600, such as an assembly line system for manufacturing a chassis for an electronic device. The initial machining of block 1602 may result in the chassis preform 100 as shown in FIG. 1, with a top surface 102 and a raised edge 104, as described above.

Figure 2:
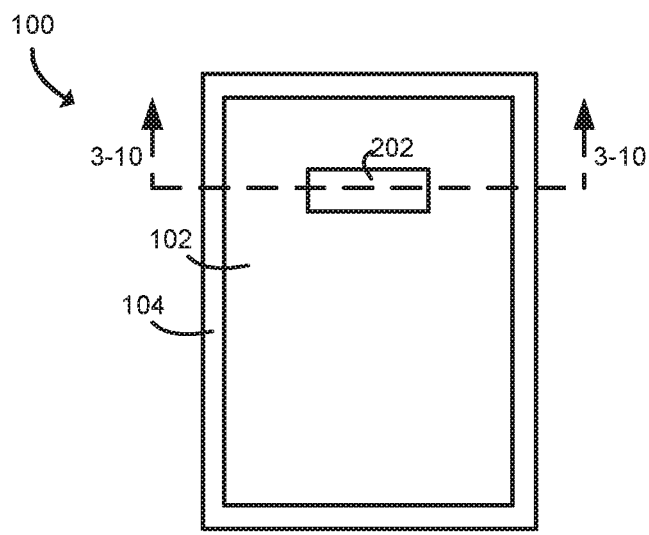
FIG. 2 is a top-down view of the chassis preform of FIG. 1 with a recess machined in one side of the chassis preform.
Figure 3:
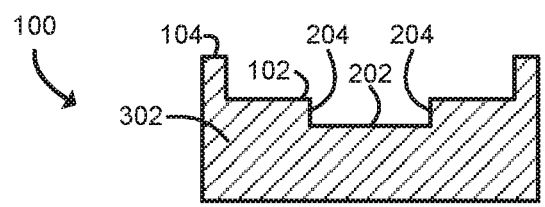
FIG. 3 is a cross section of the chassis preform shown in FIG. 2.
Figure 4:
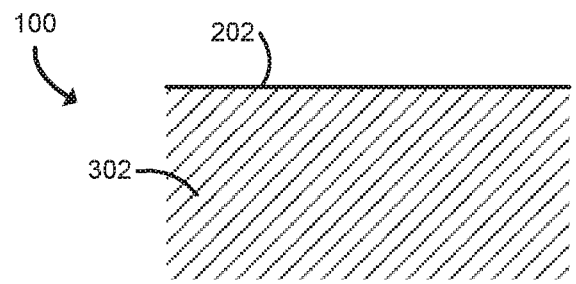
FIG. 4 is a zoomed-in view of the cross section of the chassis preform shown in FIG. 3.

Referring now to block 1604 in FIG. 16, the manufacturer machines a recess into the top surface 102 of the chassis preform 100, creating a bottom recess surface 202 and one or more side surfaces 204. FIG. 2 shows a top view of the chassis preform 100, showing the bottom recess surface 202 in the chassis preform 100. FIG. 3 shows a cross section of the chassis preform 100 with the recess, showing two side surfaces 204 and the bottom recess surface 202. As shown in FIG. 3, the chassis preform 100 is made of a bulk metal 302, such as an aluminum alloy. FIG. 4 shows a zoomed-in view of the cross section, showing the bulk metal 302 that forms the bottom recess surface 202 of the recess. The recess may be any suitable depth, such as a depth of 0.1 to 1 mm. In the illustrative embodiment, the depth of the recess is 0.4 mm. The recess may have any suitable length and width, such as 1 to 100 mm for each of the length and/or width.

Figure 5:
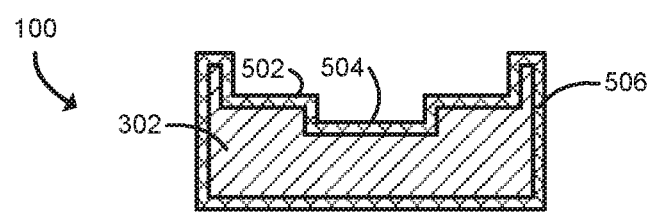
FIG. 5 is a cross section of the chassis preform shown in FIG. 2 after anodization.

Referring now to block 1606 in FIG. 16, the manufacturer may perform anodization on the chassis preform 100. As shown in FIG. 5, the anodization may create an approximately uniform anodized layer, transforming a thin portion of the bulk metal 302 to an anodized layer 506. For example, in the illustrative embodiment, a portion of the bulk aluminum alloy 302 may be transformed to a thin layer of aluminum oxide 506 (of course, the non-aluminum components in the aluminum alloy may still be present in the layer of aluminum oxide 506). After anodization, there will be an anodized bottom recess surface 504 and a top anodized surface 502. In the illustrative embodiment, the manufacturer may perform hard anodization in block 1608, such as by performing anodization in a sulfuric acid bath in block 1610. Additionally or alternatively, in some embodiments, a different anodizing process may be used, such as one with the chassis preform 100 in a chromic acid bath. In the illustrative embodiment, the thickness of the anodized layer 506 is 75 micrometers. In some embodiments, the anodized layer 506 may be more or less thick, such as 25 to 150 micrometers. The thickness of the anodized layer may depend on several factors, such as the material used, the acid used, the voltage applied, the duration of the applied voltage, etc. It should be appreciated that, in some embodiments, some or all of the preform chassis 100 other than at least a portion of the bottom recess surface 202 may be masked or otherwise blocked from being anodized.

Figure 6:
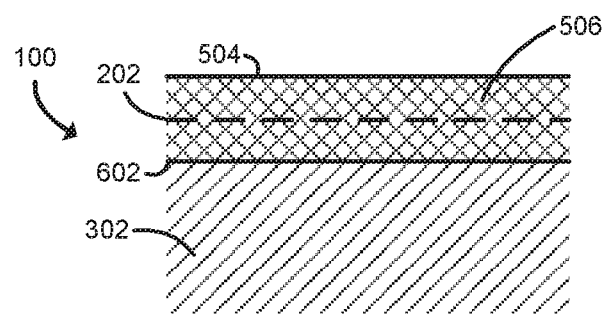
FIG. 6 is a zoomed-in view of the cross section of the chassis preform shown in FIG. 5.

It should be appreciated that, in some embodiments, such as with aluminum, the anodized layer 506 may be thicker than the thickness of the bulk metal 302 that is transformed to the anodized layer 506. For example, as shown in FIG. 6, the anodized bottom recess surface 504 may be higher than where the original bottom recess surface 202 was. The distance between the original bottom recess surface 202 and the boundary 602 between the bulk metal 302 and the anodized layer 506 may be, for example, 37.5 micrometers, and the distance between the anodized bottom recess surface 504 and the boundary 602 between the bulk metal 302 and the anodized layer 506 may be 75 micrometers.

Figure 7:
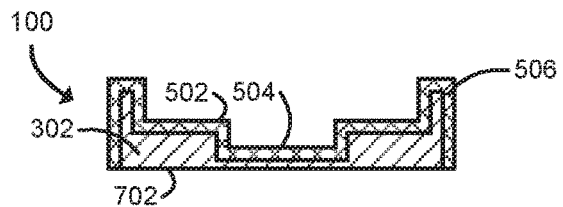
FIG. 7 is a cross section of the chassis preform shown in FIG. 5 after further machining.
Figure 8:
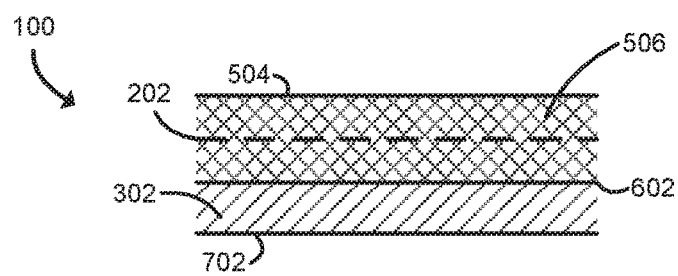
FIG. 8 is a zoomed-in view of the cross section of the chassis preform shown in FIG. 7.

Referring now to block 1612 in FIG. 16, the manufacturer may machine the side opposite the recess using a suitable machining tool or machine until the thickness of the chassis preform at the recess is at a predefined thickness. This machining process creates a new bottom surface 702, as shown in FIG. 7. FIG. 8 shows a zoomed-in view of the cross section shown in FIG. 7. As discussed in more detail below, the predefined thickness is chosen so that, after a subsequent anodization, there will be a single anodized layer between the anodized bottom recess surface 504 and the opposing surface on the bottom of the chassis preform 100.

Referring now to block 1614 in FIG. 16, the manufacturer performs a subsequent anodization on the chassis preform 100. After anodization, there will be an anodized bottom surface 902. The anodization will create a single anodized layer between the anodized bottom recess surface 504 and the anodized bottom surface 902 of the preform chassis 100. In the illustrative embodiment and similar to the first anodization, the manufacturer may perform hard anodization in block 1616, such as by performing anodization in a sulfuric acid bath in block 1618. Additionally or alternatively, in some embodiments, a different anodizing process may be used, such as one with the chassis preform 100 in a chromic acid bath. As with the first anodization, it should be appreciated that, in some embodiments, some or all of the preform chassis 100 other than at least a portion of the bottom surface 702 opposite the anodized bottom recess surface 504 may be masked or otherwise blocked from being anodized.

Figure 10:
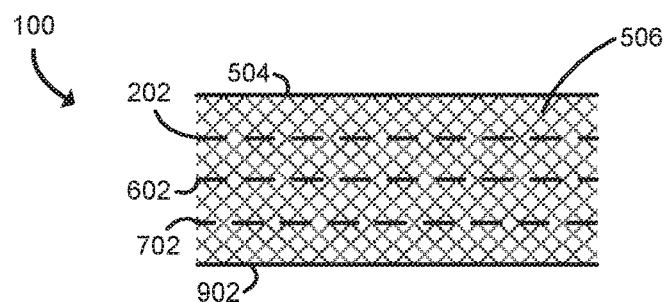
FIG. 10 is a zoomed-in view of the cross section of the chassis preform shown in FIG. 9.

As discussed above in regard to FIG. 6, it should be appreciated that, in some embodiments, such as with aluminum, the subsequent anodization may transform a layer of bulk metal 302 to a thicker anodized layer. For example, as shown in FIG. 10, the distance between the original boundary 602 and the bottom surface 702 that is created after the machining done in block 1612 may be 37.5 micrometers, and the added thickness to the anodized layer 506 (i.e., the distance between the boundary 602 and the anodized bottom surface 902) may be, for example, 75 micrometers. The thickness of the layer of bulk metal 302 that is to be transformed to be part of the anodized layer 506 is the predefined thickness discussed above in regard to block 1612. For example, the desired overall thickness of the single anodized layer 506 between the anodized bottom recess surface 504 and the bottom anodized surface 902 may be 150 micrometers. The initial anodization layer may be 75 micrometers, and the layer of the bulk metal 302 to be transformed to part of the anodization layer 506 in the subsequent anodization may be 37.5 micrometers, for a desired predefined thickness of 112.5 micrometers after the machining process described in block 1612.

Figure 9:
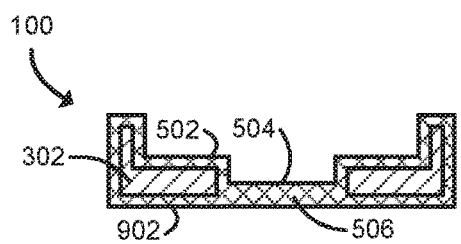
FIG. 9 is a cross section of the chassis preform shown in FIG. 7 after further anodization.
Figure 11:
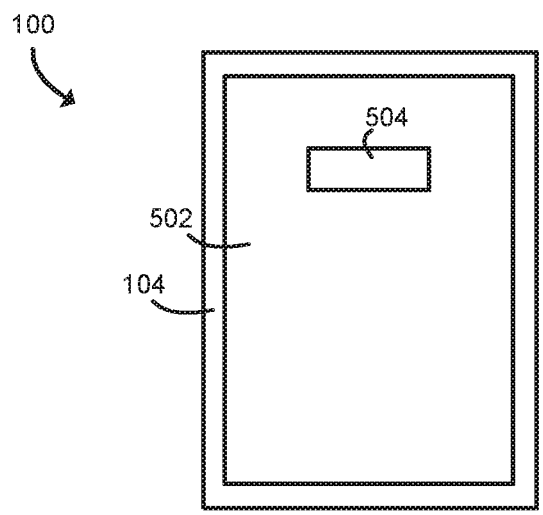
FIG. 11 is a top-down view of the chassis preform shown in FIG. 9.

It should be appreciated that, after block 1614, the chassis preform 100 has a single anodized layer 506 between the anodized bottom recess surface 504 and the bottom anodized surface 902, as shown in a cross section in FIG. 9 and as shown in a top-down view in FIG. 11. Because the anodized layer 506 (such as aluminum oxide) is non-conductive, the single anodized layer 506 between the anodized bottom recess surface 504 and the bottom anodized surface 902 allows electromagnetic waves such as radio waves to pass through with low loss.

Figure 12:
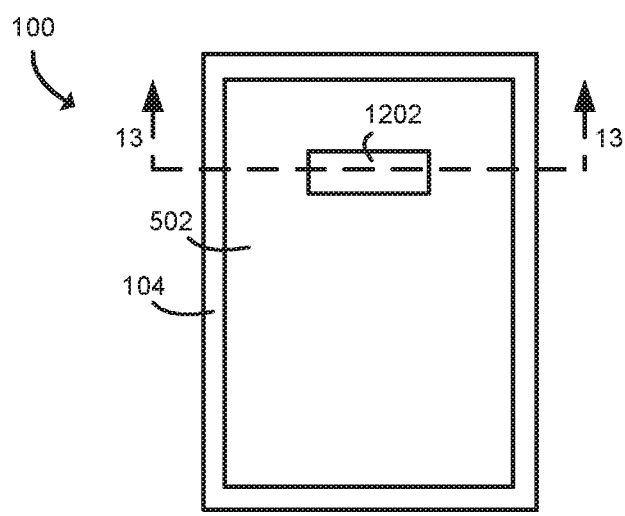
FIG. 12 is a top-down view of the chassis preform shown in FIG. 11 with a plastic insert.
Figure 13:
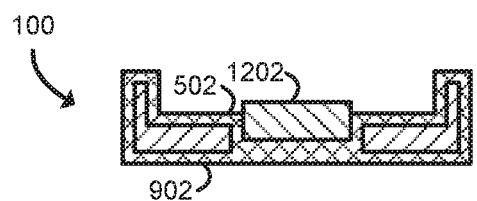
FIG. 13 is a cross section of the chassis preform with the plastic insert shown in FIG. 12.

Referring now to block 1620 in FIG. 17, the manufacturer may place a support insert 1202 in the recess, as shown in FIGS. 12 and 13. FIG. 12 shows a top-down view of the chassis preform 100, and FIG. 13 shows a cross section of the chassis preform 100. In the illustrative embodiment, the manufacturer may create the support insert 1202 through injection molding in block 1622, such as injection molding polybutylene terephthalate (PBT) in block 1624 or injection molding polyphenylene sulfide (PPS) in block 1626. Additionally or alternatively, the manufacturer may place a pre-made support insert 1202 in the recess. The support insert 1202 may be any suitable material, such as plastic, that is non-conductive or will otherwise not block radio waves from an antenna.

Figure 14:
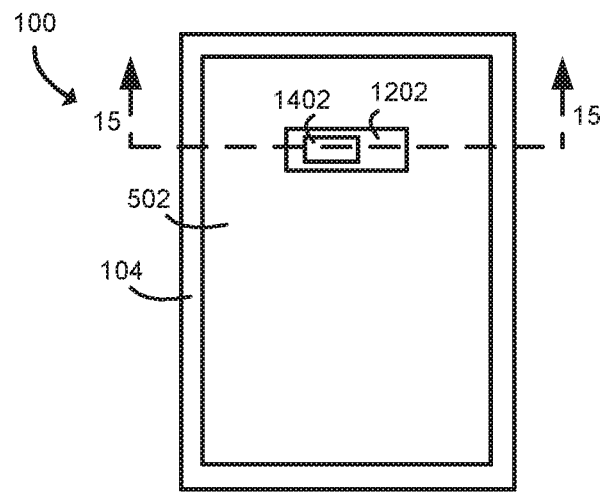
FIG. 14 is a top-down view of the chassis preform with the plastic insert shown in FIG. 12 with an antenna on the plastic insert.

Referring now to block 1628 in FIG. 17, the manufacturer may dispose an antenna 1402 near the recess such that electromagnetic waves from the antenna 1402 pass through the single anodized layer 506 between the anodized bottom recess surface 504 and the bottom anodized surface 902. The manufacturer may place the antenna 1402 on top of the support insert 1202, as shown in FIGS. 14 & 15. FIG. 14 shows a top-down view of the chassis preform 100, and FIG. 15 shows a cross section of the chassis preform 100. In some embodiments, the manufacturer may create an antenna directly on the support insert 1402 through laser direct structuring in block 1630, or the manufacturer may create an antenna on a liquid crystal polymer that forms the support insert 1202 in block 1632. In some embodiments, the manufacturer may place an antenna in the recess in direct contact with the anodized bottom recess surface 504. In such embodiments, the manufacturer may or may not place a support insert 1202 on top of the antenna 1402. It should be appreciated that other components of the electronic device, such as a printed circuit board or other electronic component, may be placed in the recess and support the single anodized layer in place of a support insert 1202. The antenna 1402 may be any kind of antenna, such as a Wi-Fi antenna, a cellular antenna, a Bluetooth® antenna, a 4G LTE antenna, a 5G antenna, etc. It should be appreciated that, in some embodiments, such as when the antenna 1402 is a 5G antenna, the antenna 1402 may be an antenna array capable of beamforming to direct a beam in a particular direction.

In block 1636, the manufacturer may complete manufacturing of the electronic device. The manufacturer may incorporate a processor, memory, a display, communication circuitry, etc. In block 1638, a user of the electronic device may operate the electronic device and, in so doing, operate the antenna 1402 to send and receive electromagnetic signals through the single anodized layer 506 between the anodized bottom recess surface 504 and the bottom anodized surface 902.

It should be appreciated that, in some embodiments, there may be advantages to the approach outline above. For example, the antenna 1404 can be placed nearby circuitry that communicates with the antenna 1404, avoiding a cable that may otherwise need to connect to the antenna 1404 in a position near an edge of the chassis and that may contribute to the overall thickness of the electronic device. The placement of the antenna 1404 described above may also allow for a thinner bezel of the electronic device. The approach described above may lead to a single metal chassis, eliminating one or more components from the manufacturing process as compared to a multi-component chassis. A single metal chassis may also have superior thermal characteristics as compared to a multi-component chassis.

It should be appreciated that the embodiment described above is one possible embodiment and that other embodiments are envisioned. For example, the manufacturer may manufacture a chassis preform 100 with more than one recess similar to the recess above adjacent to a single anodized layer through which electromagnetic waves can pass. Each recess may include one or more antennae. It should also be appreciated that the steps described above may be performed in a different order or some steps may not be performed at all. For example, in some embodiments, the support insert 1202 may be placed in the recess prior to the machining process described in block 1612. Such an approach may provide additional support to the thin portion of the chassis preform 100 near the recess during the machining process described in block 1612. In some embodiments, only a single anodization may be performed. In such embodiments, the anodization may be performed simultaneously on the bottom recess surface 202 and the bottom surface 702 or may be performed on only one of the bottom recess surface 202 or the bottom surface 702.

EXAMPLES

Illustrative examples of the devices, systems, and methods disclosed herein are provided below. An embodiment of the devices, systems, and methods may include any one or more, and any combination of, the examples described below.

Example 1 includes a method of manufacturing a chassis for an electronic device, the method comprising machining a recess into a first side of a chassis preform; performing an anodization on the chassis preform; machining a second side of the chassis preform opposite the first to decrease a thickness of the chassis preform between the first side and the second side to a predefined thickness; performing a subsequent anodization on the chassis preform, wherein the predefined thickness is sized such that the subsequent anodization results in a single anodized layer that forms a bottom recess surface of the recess and extends to the second side of the chassis preform.

Example 2 includes the subject matter of Example 1, and further including placing a support insert in the recess of the first side of the chassis preform.

Example 3 includes the subject matter of any of Examples 1 and 2, and wherein placing the support insert in the recess of the first side of the chassis preform comprises placing the support insert in the recess of the first side of the chassis preform prior to performing the subsequent anodization.

Example 4 includes the subject matter of any of Examples 1-3, and wherein placing the support insert in the recess of the first side of the chassis preform comprises creating the support insert in the recess of the first side of the chassis preform through injection molding.

Example 5 includes the subject matter of any of Examples 1-4, and further including disposing an antenna on the support insert.

Example 6 includes the subject matter of any of Examples 1-5, and wherein disposing an antenna on the support insert comprises creating an antenna on the support insert with use of laser direct structuring.

Example 7 includes the subject matter of any of Examples 1-6, and wherein disposing an antenna on the support insert comprises creating an antenna on a liquid crystal polymer substrate on the support insert.

Example 8 includes the subject matter of any of Examples 1-7, and further including completing manufacturing of the electronic device.

Example 9 includes the subject matter of any of Examples 1-8, and further including operating the antenna of the completed electronic to send and receive electromagnetic signals through the single anodized layer.

Example 10 includes the subject matter of any of Examples 1-9, and wherein the chassis preform other than the anodized portion is at least 97.5% aluminum by weight.

Example 11 includes the subject matter of any of Examples 1-10, and further including disposing an antenna near the recess in a position such that the antenna is capable of sending and receiving electromagnetic signals through the single anodized layer.

Example 12 includes the subject matter of any of Examples 1-11, and further including placing an antenna in the recess in contact with the first side.

Example 13 includes the subject matter of any of Examples 1-12, and wherein performing the anodization on the chassis preform comprises performing the anodization to create an anodized layer at least 50 micrometers thick.

Example 14 includes the subject matter of any of Examples 1-13, and wherein performing the subsequent anodization on the chassis preform comprises performing the subsequent anodization to create the single anodized layer that is at least 100 micrometers thick.

Example 15 includes the subject matter of any of Examples 1-14, and wherein performing the subsequent anodization on the chassis preform comprises performing the subsequent anodization to create the single anodized layer that is at least 150 micrometers thick.

Example 16 includes an apparatus for an electronic device, the apparatus comprising, a chassis having a recess machined into a first side of the chassis, wherein the recess is defined by a bottom recess surface machined into the first side of the chassis and at least one side surface, wherein the chassis further includes a single anodized layer that forms the bottom recess surface and extends to a second side of the chassis that opposes the first side.

Example 17 includes the subject matter of Example 16, and further including a support insert disposed in the recess.

Example 18 includes the subject matter of any of Examples 16 and 17, and further including an antenna disposed near the recess in a position such that the antenna is capable of sending and receiving electromagnetic signals through the single anodized layer.

Example 19 includes the subject matter of any of Examples 16-18, and wherein the chassis other than the anodized portion is at least 97.5% aluminum by weight.

Example 20 includes the subject matter of any of Examples 16-19, and further including an antenna disposed near the recess in a position such that the antenna is capable of sending and receiving electromagnetic signals through the single anodized layer.

The invention claimed is:

1. A method of manufacturing a chassis for an electronic device, the method comprising:
    machining a recess into a first side of a chassis preform, the recess in a first portion of the chassis preform between a machined surface of the recess and a second side opposite the first side, the recess adjacent a second portion of the chassis preform, the second portion between the first side and the second side;
    anodizing the chassis preform to form a first anodized layer on the machined surface of the recess;
    machining the second side of the chassis preform to reduce a thickness of the first portion of the chassis preform, the machining of the second side to expose an exposed surface on the second side of the chassis preform; and
    anodizing the chassis preform to form a second anodized layer on the exposed surface, the first anodized layer and the second anodized layer to overlap at the first portion of the chassis preform.

2. The method of claim 1, further including placing a support insert in the recess.

3. The method of claim 2, wherein the placing of the support insert in the recess of the first side of the chassis preform includes placing the support insert in the recess prior to anodizing the chassis preform to define the second anodized layer.

4. The method of claim 2, wherein the placing of the support insert in the recess of the first side of the chassis preform includes molding the support insert in the recess via an injection molding process.

5. The method of claim 2, further including placing an antenna on the support insert.

6. The method of claim 5, wherein the placing of the antenna on the support insert includes creating the antenna on the support insert via laser direct structuring.

7. The method of claim 5, wherein the placing of the antenna on the support insert includes producing the antenna on a liquid crystal polymer substrate of the support insert.

8. The method of claim 2, wherein the placing of the support insert in the recess is subsequent to defining the first anodized layer.

9. The method of claim 1, wherein the chassis preform is at least 97.5% aluminum by weight prior to the anodizing of the chassis preform to define the first anodized layer.

10. The method of claim 1, further including disposing an antenna near the recess to position the antenna such that the antenna is capable of sending and receiving electromagnetic signals through the first anodized layer and the second anodized layer.

11. The method of claim 1, further including placing an antenna in the recess to contact the first anodized layer.

12. The method of claim 1, wherein the first anodized layer is at least 50 micrometers thick.

13. The method of claim 12, wherein a combination of the first anodized layer and the second anodized layer is at least 100 micrometers in thickness.

14. The method of claim 12, wherein the first anodized layer and the second anodized layer collectively exhibit a thickness of at least 150 micrometers.

15. A method comprising:
   machining a recess into a first exterior surface of a chassis;
   anodizing the chassis to define a first anodized layer along the first exterior surface of the chassis;
   machining at least a portion of a second exterior surface of the chassis to expose an exposed surface of the chassis, the portion of the second exterior surface opposite the first exterior surface; and
   anodizing the chassis to define a second anodized layer of the exposed surface, the second anodized layer to overlap the first anodized layer at a first portion of the chassis between the first exterior surface and the exposed surface, the second anodized layer to be separated from the first anodized layer at a second portion of the chassis between the first exterior surface and the exposed surface, the second portion of the chassis adjacent the first portion.

16. The method of claim 15, wherein the machining of the recess into the chassis defines wings extending from the chassis.

17. The method of claim 16, further including placing a support insert in the recess.

18. The method of claim 17, further including placing an antenna to contact the support insert.

19. The method of claim 15, further including placing an antenna to contact the first anodized layer.

* * * * *